(12) United States Patent
Matano

(10) Patent No.: US 7,627,442 B2
(45) Date of Patent: Dec. 1, 2009

(54) SEMICONDUCTOR DEVICE HAVING A TEST-VOLTAGE GENERATION CIRCUIT

(75) Inventor: Tatsuya Matano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 128 days.

(21) Appl. No.: 11/760,830

(22) Filed: Jun. 11, 2007

(65) Prior Publication Data
US 2007/0296602 A1 Dec. 27, 2007

(30) Foreign Application Priority Data
Jun. 26, 2006 (JP) .............................. 2006-175816

(51) Int. Cl.
G01R 19/00 (2006.01)
(52) U.S. Cl. ....................................................... 702/64
(58) Field of Classification Search ............... 702/64; 365/189.09
See application file for complete search history.

(56) References Cited

U.S. PATENT DOCUMENTS
2005/0088881 A1* 4/2005 Miki et al. ............. 365/189.09

FOREIGN PATENT DOCUMENTS

JP 06-236925 A 8/1994
JP 07-111455 A 4/1995

* cited by examiner

Primary Examiner—Tung S Lau
Assistant Examiner—Xiuquin Sun
(74) Attorney, Agent, or Firm—Sughrue Mion, PLLC

(57) ABSTRACT

A semiconductor device includes an internal power supply line, a first power supply circuit, and second power supply circuits. The first power supply circuit includes an ordinary-voltage generation circuit supplying an ordinary voltage to the internal power supply line during an ordinary operation, and a test-voltage generation circuit supplying a test voltage to the internal power supply line during a test operation. Each of the second power supply circuits includes only an ordinary-voltage generation circuit. The number of ordinary-voltage generation circuits is thereby larger than the number of test-voltage generation circuits. Therefore, the ordinary voltage such as the precharge potential can be stably supplied to the internal power supply line while suppressing an increase in chip area.

20 Claims, 4 Drawing Sheets

SEMICONDUCTOR DEVICE HAVING A TEST-VOLTAGE GENERATION CIRCUIT

TECHNICAL FIELD

The present invention relates to a semiconductor device and, more particularly relates to a semiconductor device in which a voltage different from that supplied to an internal power supply line during an ordinary operation is supplied to the internal power supply line during a test operation.

BACKGROUND OF THE INVENTION

As well known, it is necessary in a DRAM (Dynamic Random Access Memory) to precharge bit lines with a predetermined potential, i.e., a precharge potential before a data read operation. The precharge potential is set to an intermediate potential between a higher write potential VARY of a memory cell and a lower write potential VSSA of a memory cell, that is, (VARY-VSSA)/2. If the higher write potential VARY is 1.4 V and the lower write potential VSSA is 0 V, the precharge potential is 0.7 V.

When data is actually read, a potential of a bit line connected to a memory cell storing the higher write potential VARY rises slightly from the precharge potential. Conversely, a potential of a bit line connected to a memory cell storing the lower write potential VSSA falls slightly from the precharge potential. Such changes in the potentials of bit lines are amplified by a sense amplifier.

Because an amount of a change in each bit line during a data read operation is as small as, for example, about 200 mV, it is necessary to set the precharge potential very precisely. Nevertheless, if the number of bit lines to which the precharge potential is to be supplied increases owing to high circuit integration, the precharge potential can possibly become unstable.

On the other hand, during a test operation, a potential different from the original precharge potential is often supplied to the bit lines. In this case, it is necessary to provide a voltage generation circuit generating a test voltage separately from a voltage generation circuit generating the precharge potential on a chip. This disadvantageously increases a chip area.

Japanese Patent Laid-open Publication Nos. H06-236925 and H07-111455 disclose techniques concerning generation of an internal voltage or of a test voltage.

SUMMARY OF THE INVENTION

It is therefore an object of the present invention to provide a semiconductor device in which a voltage different from that supplied to an internal power supply line during ordinary operation is supplied to the internal power supply line during test operation, and which can stably supply an ordinary voltage having a precharge potential or the like while minimizing an increase in chip area.

According to the present invention, a semiconductor device comprises: an internal power supply line; a plurality of ordinary-voltage generation circuits supplying an ordinary voltage to the internal power supply line during an ordinary operation; and a test-voltage generation circuit supplying a test voltage to the internal power supply line during a test operation, wherein number of the ordinary-voltage generation circuits is larger than number of test-voltage generation circuits.

According to the present invention, a plurality of ordinary-voltage generation circuits is allocated to one internal power supply line. Due to this, the ordinary voltage such as a precharge voltage can be stably supplied to the internal power supply line. Besides, the number of test-voltage generation circuits is smaller than that of ordinary-voltage generation circuits. It is, therefore, possible to minimize an increase in chip area.

For an ordinary semiconductor device, the ordinary-voltage generation circuit and the test-voltage generation circuit are regarded as a set and designed as one power supply circuit including both the ordinary-voltage generation circuit and the test-voltage generation circuit. Due to this, if a plurality of such power supply circuits is arranged to stably supply the ordinary voltage, the chip area considerably increases. For the semiconductor device according to the aspect of the present invention, by contrast, the ordinary-voltage generation circuit and the test-voltage generation circuit are regarded as separate circuits, and the number of former circuits is set smaller than that of latter circuits. Due to this, stabilization of the ordinary voltage and suppression of the chip area can be attained simultaneously.

According to the present invention, it is preferable that the plurality of ordinary-voltage generation circuits is arranged to be distributed almost equidistantly. By doing so, the ordinary voltage can be made more stable. Furthermore, it is preferable that the test-voltage generation circuit is arranged to be adjacent to predetermined one of the plurality of ordinary-voltage generation circuits. Namely, it suffices to provide only one set of an ordinary-voltage generation circuit and a test-voltage generation circuit. In this case, the set of the ordinary-voltage generation circuit and the test-voltage generation circuit is preferably arranged generally in a central position of a chip. By doing so, the test voltage can be supplied almost equally.

Moreover, according to the present invention, it is preferable that the semiconductor device further comprises a control circuit controlling operations performed by the plurality of ordinary-voltage generation circuits and the test-voltage generation circuit, respectively. In this case, the control circuit is preferably arranged near the predetermined one of the plurality of ordinary-voltage generation circuits and the test-voltage generation circuit. Further, according to the aspect of the present invention, it is preferable that the semiconductor device further comprises a reference-voltage generation circuit supplying a reference voltage to the plurality of ordinary-voltage generation circuits, and that the reference-voltage generation circuit is arranged near the predetermined one of the plurality of ordinary-voltage generation circuits. Namely, it suffices to include the reference-voltage generation circuit in the power supply circuit constituted by the set of the ordinary-voltage generation circuit and the test-voltage generation circuit.

According to the present invention, it is possible to stably supply the ordinary voltage such as the precharge voltage to the internal power supply line while minimizing the increase in chip area.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiment of the present invention will now be explained in detail with reference to the drawings.

Figure 1:
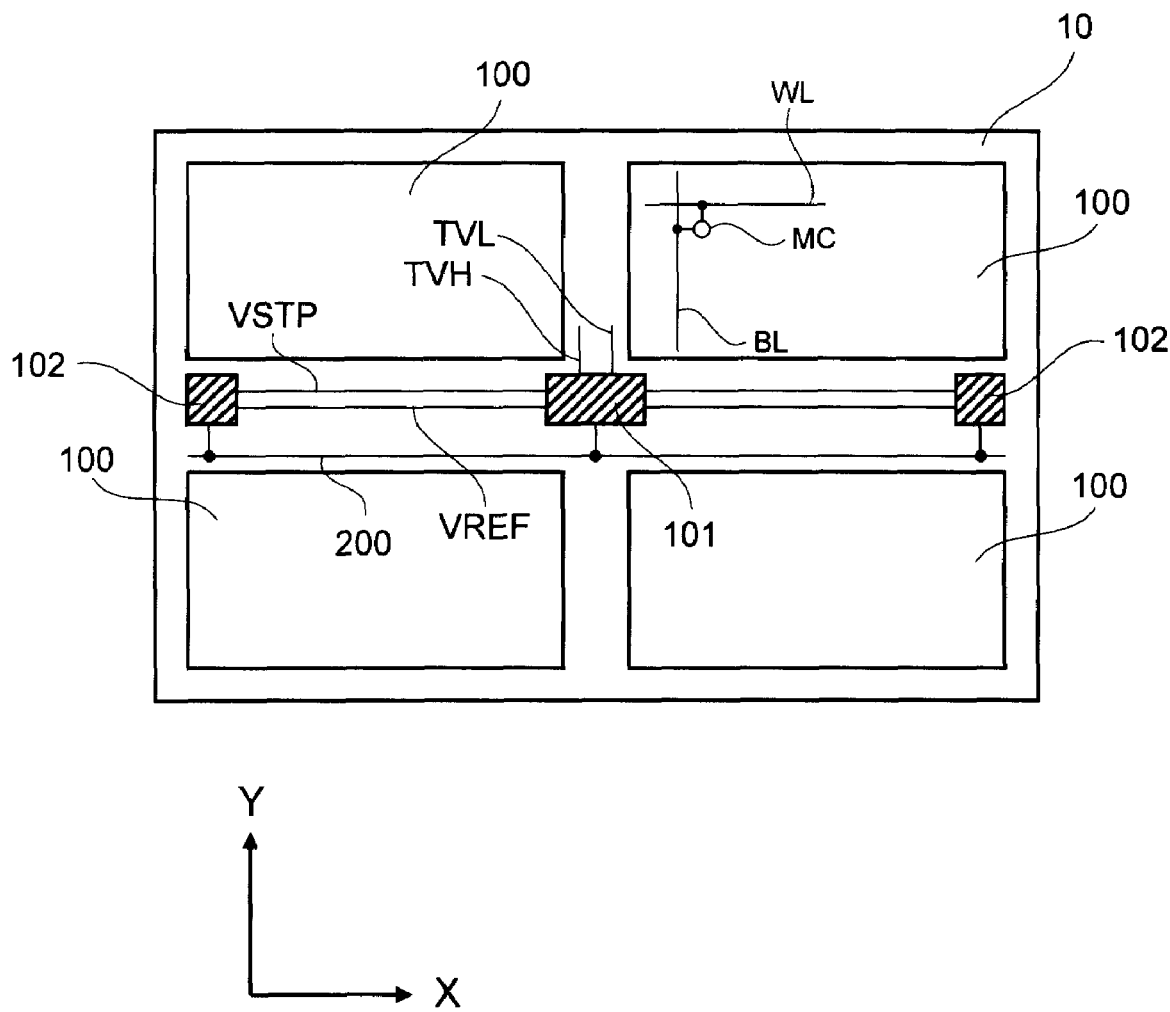
FIG. 1 is a schematic diagram showing an overall structure of a semiconductor device according to a preferred embodiment of the present invention.

FIG. 1 is a pattern diagram showing an overall structure of a semiconductor device 10 according to an embodiment of the present invention.

The semiconductor device 10 according to the present embodiment is a DRAM, and includes a plurality of (or four in the embodiment) memory mats 100. Three power supply circuits 101 and 102, that is, first and second power supply circuits 101 and 102, arranged in X direction almost equidistantly are provided between the mats 100 adjacent in Y direction. The first power supply circuit 101 is arranged generally in a central portion of a chip whereas the second power supply circuits 102 are arranged on both ends in the X direction relative to the first power supply circuit 101, respectively. In the present embodiment, the X direction is an extension direction of word lines WLs and the Y direction is an extension direction of bit lines BLs.

Figure 2:
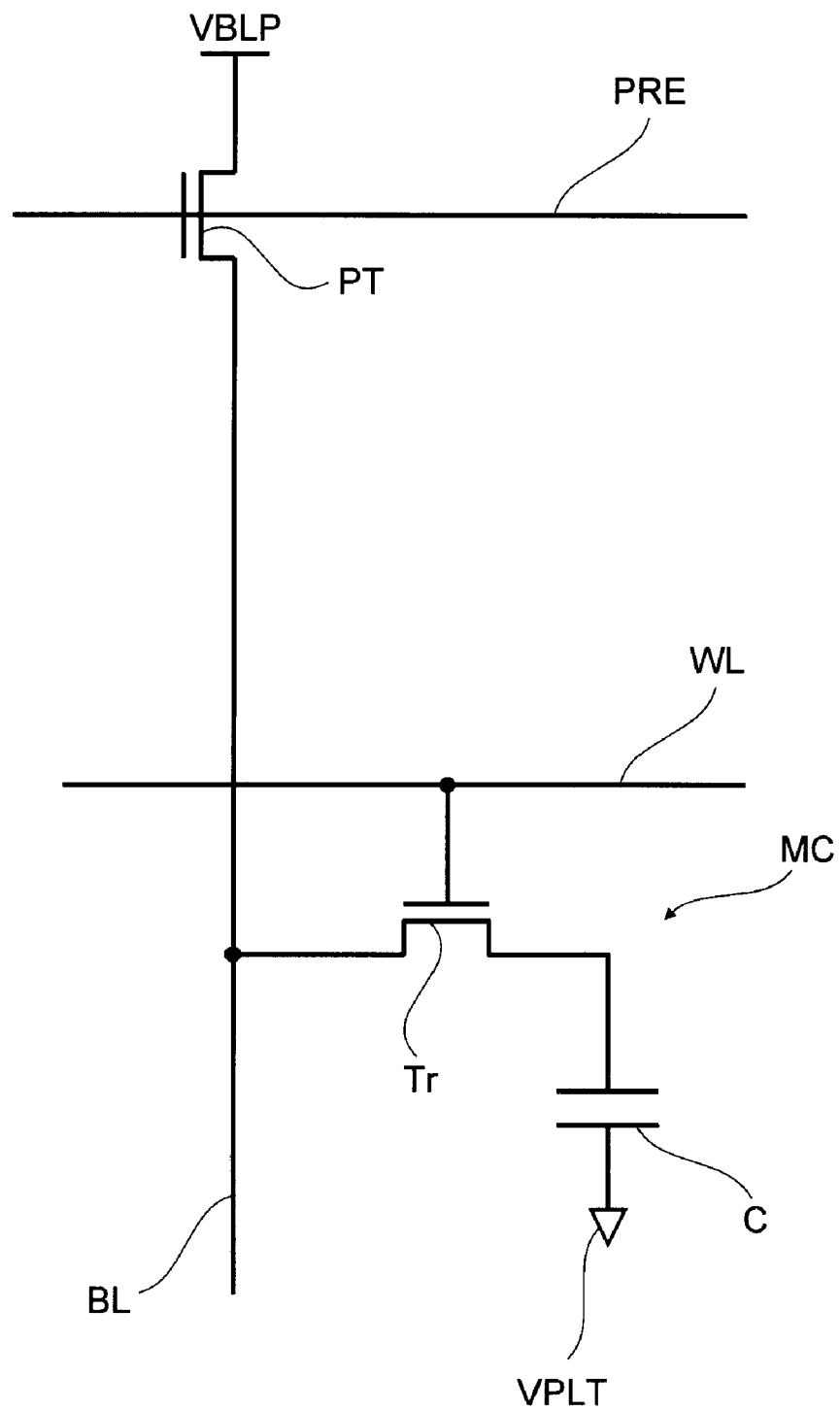
FIG. 2 is a circuit diagram of each memory cell.

FIG. 2 is a circuit diagram of each memory cell MC.

Because the semiconductor device 10 according to the embodiment is the DRAM, the memory cell MC is configured to include a transistor Tr and a cell capacitor C connected in series to a corresponding bit line BL. A gate electrode of the cell transistor Tr is connected to a corresponding word line WL. By so configuring, when a level of the corresponding word line WL becomes high, the cell transistor Tr is turned on and the cell capacitor C is connected to the corresponding bit line BL.

To read data from the memory cell MC, it is necessary to connect the bit line BL to a precharge potential VBLP via a precharge transistor PT by activating a precharge signal PRE in advance. The precharge potential VBLP is an intermediate potential between a memory-cell higher write potential VARY and a memory-cell lower write potential VSSA. Accordingly, after precharging the bit line BL with the precharge potential VBLP, if the cell transistor Tr is turned on by activating the word line WL, a potential of the bit line BL slightly changes. Namely, if the higher write potential VARY is written to the cell capacitor C, the potential of the bit line BL rises slightly from the precharge potential VBLP. If the lower write potential VSSA is written to the cell capacitor C, the potential of the bit line BL falls slightly from the precharge potential VBLP.

Meanwhile, a plate potential VPLT is constantly supplied to a plate electrode of the cell capacitor C. The plate potential VPLT is equal to the precharge potential VBLP. The precharge potential VBLP or the plate potential VPLT is generated by the first power supply circuit 101 and the second power supply circuit 102.

Figure 3:
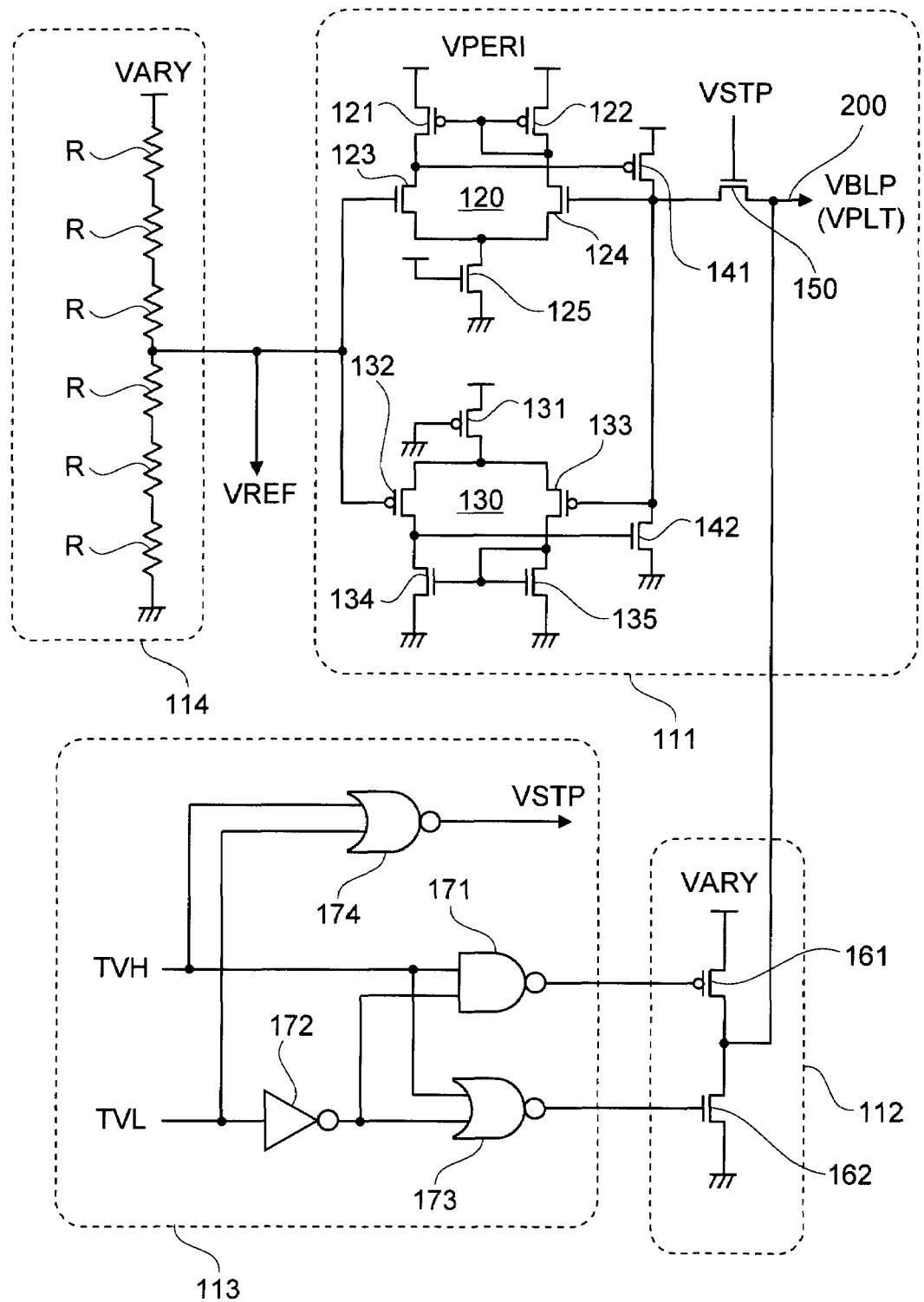
FIG. 3 is a circuit diagram showing a configuration of a first power supply circuit shown in FIG. 1.

FIG. 3 is a circuit diagram showing a configuration of the first power supply circuit 101.

As shown in FIG. 3, the first power supply circuit 101 is constituted by four circuit units, i.e., an ordinary-voltage generation circuit 111, a test-voltage generation circuit 112, a control circuit 113, and a reference-voltage generation circuit 114. These four circuit units 111 to 114 are designed as a set and dealt with as one functional block. Due to this, the circuit units 111 to 114 are arranged adjacently to one another without being distributed.

The ordinary-voltage generation circuit 111, which is a circuit for supplying an ordinary voltage to an internal power supply line 200 during the ordinary operation, includes a differential circuit 120 constituted by transistors 121 to 125 and a differential circuit 130 constituted by transistors 131 to 135. Outputs of the differential circuits 120 and 130 are supplied to gate electrodes of push-pull drivers 141 and 142 connected in series, respectively. A voltage of a common drain of the drivers 141 and 142 is stabilized to the ordinary voltage having a predetermined correspondence to a reference voltage VREF, i.e., stabilized to the precharge potential VBLP (=plate potential VPLT), and the precharge potential VBLP is supplied to the internal power supply line 200 via a cutoff transistor 150.

In this way, during the ordinary operation, the ordinary voltage, i.e., precharge potential VBLP (=plate potential VPLT) is supplied to the internal power supply line 200. As shown in FIG. 1, the internal power supply line 200 is arranged to spread in the X direction and acts to supply the precharge potential VBLP and the plate potential VPLT to each memory mat 100.

The test-voltage generation circuit 112, which is a circuit for supplying the test voltage to the internal power supply line 200 during the test operation, is configured to include drivers 161 and 162 similar to the drivers 141 and 142 included in the ordinary-voltage generation circuit 111. Differently from the ordinary-voltage generation circuit 111, one of the drivers 161 and 162 constituting the test-voltage generation circuit 112 is fully turned on and the other is fully turned off during the test operation. In other words, the voltage output from the test-voltage generation circuit 112 during the test operation is either the higher write potential VARY or a ground potential VSS.

If the higher write potential VARY or the ground potential VSS is supplied to the internal power supply line 200, the semiconductor device 10 is unable to operate normally. However, a test of forcedly supplying such a potential to the internal power supply line 200 is conducted before shipping. The drivers 161 and 162 are turned on only at the time of performing the test operation. During the ordinary operation, both the drivers 161 and 162 are kept to be turned off.

Operations performed by the drivers 161 and 162 constituting the test-voltage generation circuit 112 are controlled by the control circuit 113. As shown in FIG. 3, the control circuit 113 includes gates circuits 171 to 173 for controlling the drivers 161 and 162, and a first test signal TVH and a second test signal TVL are supplied to the control circuit 113 from outside. During the test operation, one of the first test signal TVH and the second test signal TVL is set to high level and the other is set to low level. During the ordinary operation, both the first test signal TVH and the second test signal TVL are kept to the low level.

Specifically, if the first test signal TVH is set to the high level and the second test signal TVL is set to the low level during the test operation, the driver 161 included in the test-voltage generation circuit 112 is turned on and the driver 162 included therein is turned off, respectively. The higher write potential VARY is thereby supplied to the internal power supply line 200 in direct. On the other hand, if the first test signal TVH is set to the low level and the second test signal TVL is set to the high level during the test operation, the driver 161 included in the test-voltage generation circuit 112 is turned off and the driver 162 included therein is turned on, respectively. The ground voltage VSS is thereby supplied to the internal power supply line 200 in direct.

Furthermore, the control circuit 113 includes a gate circuit 174 receiving both the first test signal TVH and the second test signal TVL. If one of the first test signal TVH and the second test signal TVL is at the high level (that is, during the test operation), a stop signal VSTP is at low level. If both the first test signal TVH and the second test signal TVL are at the low level (that is, during the ordinary operation), the stop signal VSTP is at high level.

The stop signal VSTP is supplied to a gate electrode of the cutoff transistor 150 included in the ordinary-voltage generation circuit 111. Therefore, if both the first test signal TVH and the second test signal TVL are at the low level, that is, during the ordinary operation, the cutoff transistor 150 is turned on. If one of the first test signal TVH and the second test signal TVL is at the high level, that is, during the test operation, the cutoff transistor 150 is turned off. By so setting, the potential generated by the ordinary-voltage generation circuit 111 is supplied to the internal power supply line 200 during the ordinary operation, and the potential generated by the test-voltage generation circuit 112 is supplied to the internal power supply line 200 during the test operation.

Moreover, the first power supply circuit 101 includes the reference-voltage generation circuit 114. The reference-voltage generation circuit 114 is configured by ladder resistors Rs connected in series between the higher write potential VARY and the ground potential VSS, and a potential divided by the ladder resistors Rs is used as the reference voltage VREF. The reference voltage VREF is supplied to gate electrodes of the transistors 123 and 132 included in the respective differential circuits 120 and 130.

Figure 4:
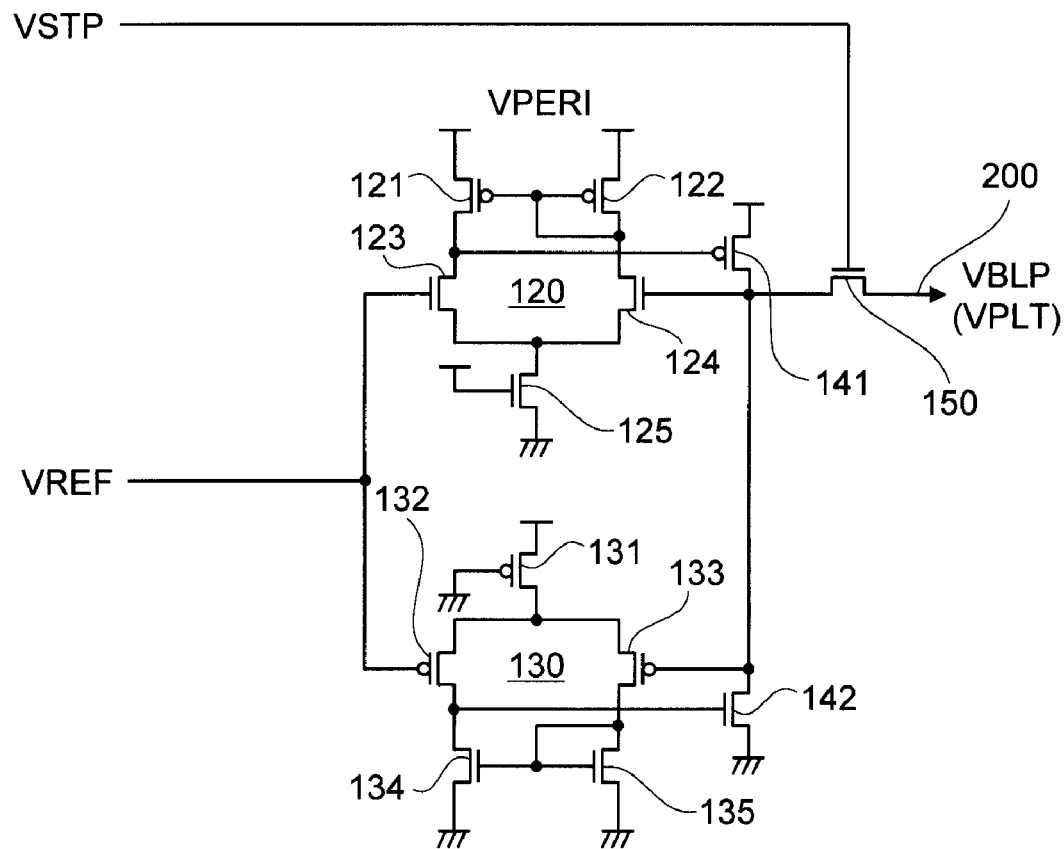
FIG. 4 is a circuit diagram showing a configuration of each of second power supply circuits shown in FIG. 2.

FIG. 4 is a circuit diagram showing a configuration of each of the second power supply circuits 102.

As shown in FIG. 4, the second power supply circuit 102 is configured, as compared with the first power supply circuit 101, so that the test-voltage generation circuit 112, the control circuit 113, and the reference-voltage generation circuit 114 are eliminated from the first power supply circuit 101. Namely, the second power supply circuit 102 is configured to include only the ordinary-voltage generation circuit 111. Due to this, the second power supply circuit 102 is far smaller than the first power supply circuit 101 in occupation area on the chip.

As shown in FIG. 1, the reference voltage VREF to be used by the second power supply circuits 102 is supplied from the reference-voltage generation circuit 114 included in the first power supply circuit 101. In addition, the stop signal VSTP to be used by the second power supply circuits 102 is supplied from the control circuit 113 included in the first power supply circuit 101.

In this manner, according to the present embodiment, the three power supply circuits 101 and 102 are allocated to one internal power supply line 200, and arranged to be distributed almost equidistantly. Accordingly, the three ordinary-voltage generation circuits 111 are arranged to be distributed almost equidistantly. This can further stabilize the precharge potential VBLP (=plate potential VPLT) serving as the ordinary voltage.

Furthermore, in the semiconductor device 10 according to the embodiment, the test-voltage generation circuit 112 and the like are not provided in all of the power supply circuits 101 and 102 but are provided only in the first power supply circuit 101 arranged in the central position of the chip while each of the other power supply circuits 102 is constituted only by the ordinary-voltage generation circuit 111. It is, therefore, possible to minimize the increase in chip area.

As explained above, for an ordinary semiconductor device, the ordinary-voltage generation circuit and the test-voltage generation circuit are regarded as a set and designed as one functional block including both the ordinary-voltage generation circuit and the test-voltage generation circuit. For the semiconductor device according to the present embodiment, by contrast, the first power supply circuit 101 including the test-voltage generation circuit 112 and the like and the second power supply circuits 102 each of which does not include the test-voltage generation circuit 112 and the like are employed separately. Due to this, despite connection of a plurality of power supply circuits to one internal power supply line 200, the increase in chip area can be suppressed. In other words, stabilization of the ordinary voltage and suppression of the chip area can be attained simultaneously.

The present invention is in no way limited to the aforementioned embodiments, but rather various modifications are possible within the scope of the invention as recited in the claims, and naturally these modifications are included within the scope of the invention.

For example, according to the present embodiment, one first power supply circuit 101 and the two second power supply circuits 102 are laid out on the chip, thereby employing the three ordinary-voltage generation circuits 111 in all. However, the present invention is not limited to the layout according to the present embodiment. As long as the number of ordinary-voltage generation circuits 111 is larger than that of the test-voltage generation circuits 112, any desired layout can be adopted.

Moreover, the embodiments have been described while referring to the case where the present invention is applied to the DRAM by way of example. However, the application target of the present invention is not limited to the DRAM. As long as the voltage different from the voltage supplied to the internal power supply line during the ordinary operation is supplied thereto during the test operation, the present invention is applicable to other types of semiconductor devices.

What is claimed is:

1. A semiconductor device comprising:
    an internal power supply line;
    a plurality of ordinary-voltage generation circuits each supplying an ordinary voltage to the internal power supply line during an ordinary operation, the internal power supply line being coupled in common to the ordinary-voltage generation circuits to receive the ordinary voltage from each of the ordinary-voltage generation circuits; and
    at least one test-voltage generation circuit supplying a test voltage to the internal power supply line during a test operation, the internal power supply line being supplied with the test voltage in place of the ordinary voltage during the test operation;
    wherein the ordinary-voltage generation circuits are larger in number than the test-voltage generation circuits.

2. The semiconductor device as claimed in claim 1, wherein the plurality of ordinary-voltage generation circuits are arranged to be distributed almost equidistantly.

3. The semiconductor device as claimed in claim 1, wherein the internal power supply line supplies a precharge potential to a plurality of bit lines.

4. The semiconductor device as claimed in claim 1, further comprising a plurality of switches, each of which is connected between said one of said plurality of ordinary-voltage generation circuits and said internal power supply line,
    wherein during said test operation, said plurality of switches operates to electrically disconnect said plurality of ordinary-voltage generation circuits from said internal power supply line.

5. A semiconductor comprising:
    an internal power supply line;

a plurality of ordinary-voltage generation circuits each supplying an ordinary voltage to the internal power supply line during an ordinary operation, the internal power supply line being coupled in common to the ordinary-voltage generation circuits to receive the ordinary voltage from each of the ordinary-voltage generation circuits; and at least one test-voltage generation circuit supplying a test voltage to the internal power supply line during a test operation, the internal power supply line being supplied with the test voltage in place of the ordinary voltage during the test operation, wherein the ordinary-voltage generation circuits are larger in number than the test-voltage generation circuits, and wherein the test-voltage generation circuit is arranged to be adjacent to predetermined one of the plurality of ordinary-voltage generation circuits.

6. The semiconductor device as claimed in claim 5, wherein the predetermined one of the plurality of ordinary-voltage generation circuits is arranged generally in a central position of a semiconductor chip.

7. The semiconductor device as claimed in claim 5, further comprising a control circuit controlling operations of the plurality of ordinary-voltage generation circuits and the test-voltage generation circuit, wherein the control circuit is arranged near the predetermined one of the plurality of ordinary-voltage generation circuits and the test-voltage generation circuit.

8. The semiconductor device as claimed in claim 5, further comprising a reference-voltage generation circuit supplying a reference voltage to the plurality of ordinary-voltage generation circuits, wherein the reference-voltage generation circuit is arranged near the predetermined one of the plurality of ordinary-voltage generation circuits.

9. A semiconductor device comprising an internal power supply line; at least one first power supply circuit; and a plurality of second power supply circuits, the power supply line being coupled in common to the first power supply circuit and the second power supply circuits;

the first power supply circuit including:

an ordinary-voltage generation circuit generating an ordinary voltage during an ordinary operation, a test-voltage generation circuit generating a test voltage during a test operation, a control circuit controlling the first power supply circuit such that the ordinary-voltage generation circuit supplies the ordinary voltage to the internal power supply line during the ordinary operation and the test-voltage generation circuit supplies the test voltage to the internal power supply line during the test operation, and a reference-voltage generation circuit supplying a reference voltage to at least the ordinary-voltage generation circuits, wherein the ordinary-voltage generation circuit, the test-voltage generation circuit, the control circuit, and the reference-voltage generation circuit are arranged adjacently to one another;

each of the second power supply circuits generating the ordinary voltage during the ordinary operation; and the control circuit of the first power supply circuit further controlling the second power supply circuits such that each of the second power supply circuits supplies the ordinary voltage to the internal power supply line during the ordinary operation.

10. The semiconductor device as claimed in claim 9, wherein the first and second power supply circuits are arranged to be distributed almost equidistantly.

11. The semiconductor device as claimed in claim 9, wherein the first power supply circuit is arranged generally in a central position of a semiconductor chip.

12. The semiconductor device as claimed in claim 9, wherein the internal power supply line supplies a precharge potential to a plurality of bit lines.

13. The semiconductor device as claimed in claim 9, further comprising a plurality of switches, each of which is connected between said one of said plurality of ordinary-voltage generation circuits and said internal power supply line, wherein during said test operation, said plurality of switches operates to interrupt said ordinary voltage supplied by said plurality of ordinary-voltage generation circuits.

14. A semiconductor device comprising:

an internal circuit;

a power supply line coupled to the internal circuit;

a plurality of first voltage generation circuits coupled in common to the power supply line, each of the first voltage generation circuits generating and supplying, when activated, a first power voltage to the power supply line and stopping, when deactivated, generation and supply of the first power voltage to the power supply line;

a second voltage generation circuit coupled to the power supply line, the second voltage generation circuit generating and supplying, when activated, a second power voltage to the power supply line and stopping, when deactivated, generation and supply of the second power voltage to the power supply line, the first voltage being different from the second voltage; and a control circuit coupled in common to the first voltage generation circuits and the second voltage generation circuit and controlling the first and second voltage generation circuits to activate each of first voltage generation circuits while deactivating the second voltage generation circuit during an ordinary operation and to activate the second voltage generation circuit while deactivating each of the first voltage generation circuits during a test operation.

15. The device as claimed in claim 14, wherein each of the first voltage generation circuits includes a voltage generator having an output node at which the first voltage is generated and a first switch coupled between the output node of the voltage generator and the power supply line, and the control circuit turns the first switch on to activate each of the first voltage generation circuits and off to deactivate each of the first voltage generation circuits.

16. The device as claimed in claim 14, wherein the second voltage generation circuit includes a voltage line supplied with the second voltage and a second switch coupled between the voltage line and the power supply line, and the control circuit turns the second switch on to activate the second voltage generation circuit and off to deactivate the second voltage generation circuit.

17. The device as claimed in claim 14, wherein the second voltage generation circuits and the control circuit are arranged adjacently to one of the first voltage generation circuit and remotely from remaining one or ones of the second voltage generation circuits.

18. The device as claimed in claim 14, further comprising first and second memory areas each including a plurality of memory cells, each of the first and second memory areas having first and second sides opposing to each other, the first side of the first memory area facing with the second side of the second memory area, a first one of the first voltage generation circuits, the second voltage generation circuit and the control circuit being disposed adjacently to the first side of the first memory area and the second side of the second memory area, a second of the first voltage generation circuits being disposed adjacently to the second side of the first memory area, and a third one of the first voltage generation circuits being disposed adjacently to the first side of the second memory area.

19. The device as claimed in claim 18, wherein each of the first voltage generation circuits includes a voltage generator having an output node at which the first voltage is generated and a first switch coupled between the output node of the voltage generator and the power supply line, and the control circuit turns the first switch on to activate, each of the first voltage generation circuits and off to deactivate each of the first voltage generation circuits.

20. The device as claimed in claim 19, wherein the second voltage generation circuit includes a voltage line supplied with the second voltage and a second switch coupled between the voltage line and the power supply line, and the control circuit turns the second switch on to activate the second voltage generation circuit and off to deactivate the second voltage generation circuit.

* * * * *